United States Patent
Terayama et al.

(10) Patent No.: US 7,405,137 B2
(45) Date of Patent: Jul. 29, 2008

(54) METHOD OF DICING A SEMICONDUCTOR SUBSTRATE INTO A PLURALITY OF SEMICONDUCTOR CHIPS BY FORMING TWO CUTTING GROOVES ON ONE SUBSTRATE SURFACE AND FORMING ONE CUTTING GROOVE ON AN OPPOSITE SUBSTRATE SURFACE THAT OVERLAPS THE TWO CUTTING GROOVES

(75) Inventors: Satoshi Terayama, Kawasaki (JP); Hirohisa Matsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 350 days.

(21) Appl. No.: 11/157,855

(22) Filed: Jun. 22, 2005

(65) Prior Publication Data

US 2006/0223234 A1    Oct. 5, 2006

(30) Foreign Application Priority Data

Mar. 31, 2005    (JP)    ............................. 2005-105233

(51) Int. Cl.
    *H01L 21/8258*    (2006.01)
(52) U.S. Cl. ................ 438/462; 438/464; 257/E21.602
(58) Field of Classification Search ................. 438/462
    See application file for complete search history.

(56) References Cited

U.S. PATENT DOCUMENTS 5,213,994 A * 5/1993 Fuchs .......................... 438/421
5,422,286 A * 6/1995 Yang ........................... 438/133
5,904,548 A * 5/1999 Orcutt ......................... 438/462
6,271,102 B1 * 8/2001 Brouillette et al. .......... 438/462
6,300,224 B1 * 10/2001 Arima et al. ................. 438/462
6,841,482 B2   1/2005 Boyle
7,265,034 B2 * 9/2007 Lu et al. ...................... 438/463

FOREIGN PATENT DOCUMENTS

| CN | 1318206 A | 10/2001 |
|---|---|---|
| CN | 1481290 A | 3/2004 |
| JP | 7-183255 | 7/1995 |
| JP | 10-83974 | 3/1998 |
| JP | 2003-45826 | 2/2003 |

OTHER PUBLICATIONS

Chinese Office Action dated Aug. 3, 2007 issued in corresponding Chinese Application No. 200510083385.3.

* cited by examiner

*Primary Examiner*—Stephen W Smoot
(74) *Attorney, Agent, or Firm*—Westerman, Hattori, Daniels & Adrian, LLP.

(57)    ABSTRACT

In a manufacturing method of a semiconductor device, a semiconductor substrate having a plurality of semiconductor chips formed on one of principal surfaces of the substrate is cut into the plurality of semiconductor chips through dicing. A first cutting process is formed on one of the principal surfaces of the substrate to produce two cutting grooves between two neighboring ones of the plurality of semiconductor chips, each cutting groove being adjacent to one of the neighboring ones of the plurality of semiconductor chips. A second cutting process is performed on the other of the principal surfaces of the substrate to produce a cutting groove overlapping the two cutting grooves produced by the first cutting process.

12 Claims, 5 Drawing Sheets

METHOD OF DICING A SEMICONDUCTOR SUBSTRATE INTO A PLURALITY OF SEMICONDUCTOR CHIPS BY FORMING TWO CUTTING GROOVES ON ONE SUBSTRATE SURFACE AND FORMING ONE CUTTING GROOVE ON AN OPPOSITE SUBSTRATE SURFACE THAT OVERLAPS THE TWO CUTTING GROOVES

CROSS-REFERENCE TO RELATED APPLICATIONS

This application is based upon and claims the benefit of priority of Japanese Patent Application No. 2005-105233, filed on Mar. 31, 2005, the entire contents of which are herein incorporated by reference.

BACKGROUND OF THE INVENTION

1. Field of the Invention

The present invention relates to a manufacturing method of a semiconductor device in which a semiconductor substrate (wafer) having a plurality of semiconductor chips formed on one of principal surfaces of the substrate is cut into the semiconductor chips through dicing.

2. Description of the Related Art

In electronic devices, such as a sensor chip, in which the plurality of semiconductor devices are adjoined to each other and mounted as the module, it is necessary to shorten the distance between the adjacent semiconductor devices as much as possible, and make the sensor region continuous without interruption. What is required for such electronic devices is the technology which cuts the semiconductor wafer into semiconductor chips with high accuracy of the outside dimensions thereof.

To cut the semiconductor substrate (wafer) having the plurality of semiconductor chips formed on one of the principal surfaces of the substrate into the semiconductor chips, the dicing process which is known as one of cutting processes is performed. In this respect, the principal surfaces are usually the front and back surfaces of the substrate, and the semiconductor chips are formed on either the front surface or the back surface of the substrate.

In the dicing process, the wafer is cut into the chips while the cutting blade with the diamond particles embedded is rotated at high speed. Since the wafer is mechanically cut with the cutting blade and a region of the wafer corresponding to the blade width is lost, it is necessary to provide the wafer with the region which is needed for the cutting in the dicing process.

Generally, the width dimension of this region in the semiconductor wafer is determined by taking into consideration the blade width, the cutting accuracy, and the damage to the semiconductor chip.

Moreover, the dicing is classified into the two methods: the half cut method and the full cut method, depending on the quantity of cutting (depth) of the semiconductor substrate.

The half cut method is a method in which the semiconductor substrate is cut to a certain depth in the middle of the semiconductor substrate thickness. Usually, in the case of the half cut method, it is necessary to perform an additional cutting process (breaking) which cuts away the non-cut portion of the wafer after the end of the dicing process.

On the other hand, the full cut method is a method in which the semiconductor substrate is fully cut for the entire thickness of the semiconductor substrate. Consequently, the semiconductor substrate is cut to the depth at which the semiconductor chips are completely separated from each other.

In order to avoid scattering of the thus separated semiconductor chips, the full cut method requires performing, before the start of the dicing process, the process of attaching the dicing tape to fix the other of the principal surfaces of the substrate to the jig called the dicing frame.

Moreover, there are two kinds of methods: the single cut method and the double cut method, which are usually performed in the dicing process. In the case of the single cut method, a dicing groove is formed in the semiconductor substrate by performing a cutting action at a time. In the case of the double cut method, two dicing grooves are formed in the semiconductor substrate by performing a cutting action at a time.

For the purposes of reducing the influences of chipping around the cutting zone when performing the dicing process and reducing the influences caused by the decrease of the blade width due to the blade wear, the adoption of the double cut method attracts attention.

Concerning the dicing used for the semiconductor-device manufacturing method, there is known the conventional technology disclosed in Japanese Laid-Open Patent Applications No. 2003-045826, No. 10-083974 and No. 07-183255.

In the dicing technology of Japanese Laid-Open Patent Application No. 2003-045826, the semiconductor-device manufacturing method which uses the single cut method to form one dicing groove along with the dicing line is proposed.

However, in the above-mentioned single cut method, while the cutting process is advanced, the thickness of the dicing blade becomes thin, and variations of the dicing width in cutting the semiconductor substrate may be produced. This method is not appropriate for the case where high accuracy of the outside dimensions of the semiconductor chip is required. For example, the required accuracy of the outside dimensions is about +0/−15 micrometers to the target value.

In the dicing technology of Japanese Laid-Open Patent Applications No. 10-083974 and No. 07-183255, the method in which the cutting process is performed on both the front surface and the back surface of the semiconductor device is proposed.

However, in the above-mentioned method, the blade width becomes thin due to wearing of the blade produced every time the dicing action is performed at a time, and the accuracy of the outside dimensions becomes insufficient. Namely, the outside dimensions of the resulting semiconductor chip may be larger than the design values. This method is also inappropriate for the case where high accuracy of the outside dimensions of the semiconductor chip is required.

Accordingly, in the conventional dicing method using the single dicing blade, there is the problem in that the outside dimensions of the semiconductor chip vary depending on the change of the dicing blade width. To obviate the problem, the two-blade dicing method is proposed. In this method, two dicing blades are used, and the dicing is performed on the semiconductor substrate by placing the dicing blades in proximity to each other in the cutting zone.

FIG. 1 shows the structure of the dicing grooves in the semiconductor substrate which are formed according to the two-blade dicing method with the two dicing blades in proximity.

In FIG. 1, the reference numeral 1 denotes the semiconductor substrate (for example, silicon), 2 denotes the electrode layer which forms a part of the semiconductor chips formed on one of the principal surfaces (the front surface) of the semiconductor substrate 1, 4A and 4B denote the dicing grooves, and 6 denotes the inner side surface of each of the dicing grooves 4A and 4B. The dicing grooves 4A and 4B are located in proximity to the adjoining semiconductor chips and formed on both the sides of the dicing line between the adjoining semiconductor chips. The dicing grooves 4A and 4B are formed by cutting the semiconductor substrate 1 to the depth at which the other of the principal surfaces (the back surface) of the semiconductor substrate 1 is reached.

In the above-mentioned structure, the inner side surfaces (semiconductor chip side surface) 6 of the dicing grooves 4A and 4B are accurately cut at a fixed distance from the metal layer 2 at the outermost periphery of the semiconductor chip formation part. Thus, it is possible to obtain the outside dimensions of the semiconductor chip concerned at high accuracy.

However, the above-mentioned dicing process uses the full cut method in which the semiconductor substrate 1 is cut, on both the sides of the dicing line on the substrate 1, fully to the depth covering the entire thickness of the substrate 1.

For this reason, a crack may be produced on the back surface of the semiconductor substrate 1 at the back side portions 9 of the dicing grooves 4A and 4B. Moreover, the semiconductor substrate portion 7 located between the dicing groove 4A and the dicing groove 4B may disperse when the dicing is performed. This will become the cause of the damage of the semiconductor chip part.

SUMMARY OF THE INVENTION

An object of the present invention is to provide an improved semiconductor-device manufacturing method in which the above-mentioned problems are eliminated.

Another object of the present invention is to provide a semiconductor-device manufacturing method in which a dicing process of the semiconductor substrate is performed with high accuracy of the outside dimensions, so that the manufacture of the semiconductor chips having desired outside dimensions is possible and improvement of the manufacture yield is possible.

In order to achieve the above-mentioned objects, the present invention provides a semiconductor-device manufacturing method in which a semiconductor substrate having a plurality of semiconductor chips formed on one of principal surfaces of the substrate is cut into the plurality of semiconductor chips through dicing, the manufacturing method comprising the steps of: performing a first cutting process on one of the principal surfaces of the substrate to produce two cutting grooves between two neighboring ones of the plurality of semiconductor chips, each cutting groove being adjacent to one of the neighboring ones of the plurality of semiconductor chips; and performing a second cutting process on the other of the principal surfaces of the substrate to produce a cutting groove overlapping the two cutting grooves produced by the first cutting process.

According to the semiconductor-device manufacturing method of the present invention, it is possible to easily produce the semiconductor chips with high accuracy of the outside dimensions. And the scattering of the semiconductor substrate materials when the dicing process is performed can be prevented. Moreover, the occurrence of damage or flaws of the semiconductor chip surfaces can be prevented. Therefore, the semiconductor chips can be produced with high accuracy of the outside dimensions and high manufacture yield can be attained.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the present invention with reference to the accompanying drawings.

Figure 1:
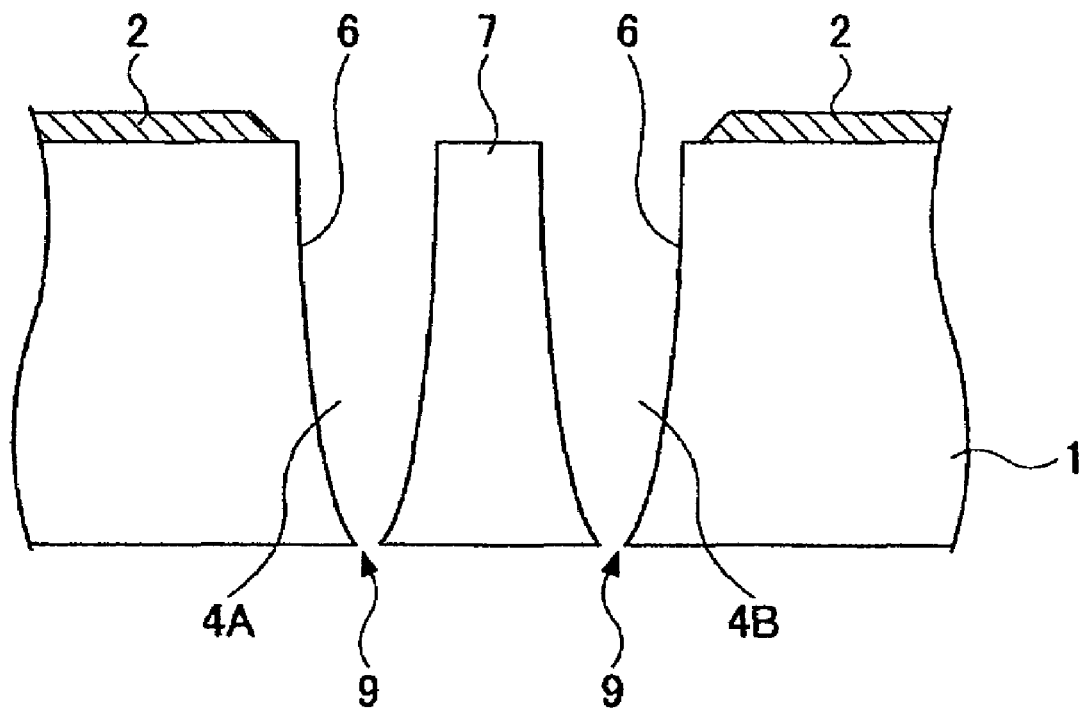
FIG. 1 is a cross-sectional view of the dicing grooves in the substrate which are formed according to the two-blade dicing method.
Figure 2A:
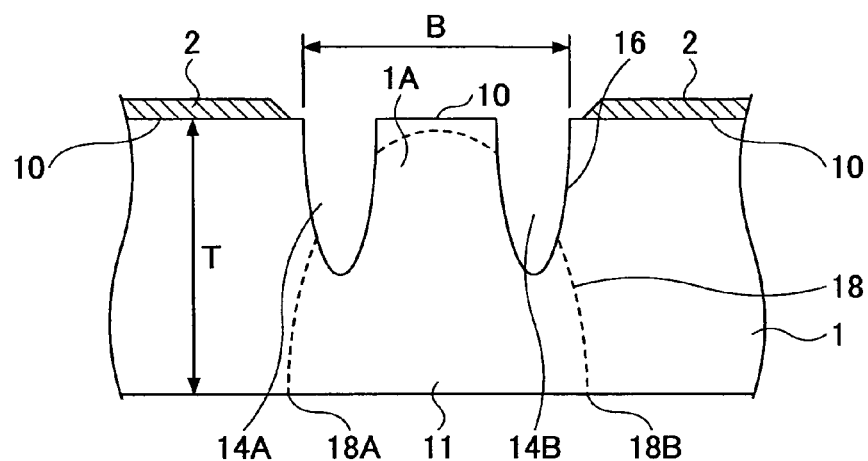
FIG. 2A and FIG. 2B are cross-sectional and plan views of the dicing grooves in the substrate which are formed according to the semiconductor-device manufacturing method in one embodiment of the invention.
Figure 2B:
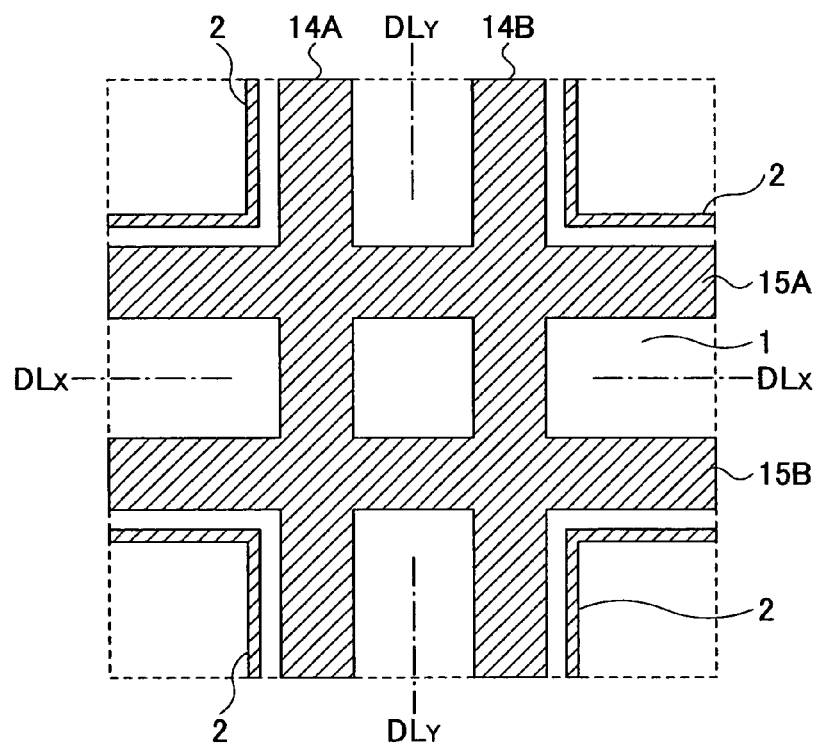

FIG. 2A and FIG. 2B show the structure of the dicing grooves in the semiconductor substrate which are formed according to the semiconductor-device manufacturing method in one embodiment of the invention.

In FIG. 2A and FIG. 2B, the reference numeral 1 denotes the semiconductor substrate (wafer), 2 denotes the metal layer which is arranged at the outermost periphery of each of the plurality of semiconductor chips arranged in the matrix formation on one of the principal surfaces (the front surface 10) of the substrate 1 concerned and forms the moisture-resistant ring.

Moreover, in FIG. 2A and FIG. 2B, the reference numeral 11 denotes the other of the principal surfaces (the back surface) of the substrate 1 concerned, 14A, 14B, 15A, 15B denote the dicing grooves which are formed along the dicing lines DLx and DLy in the lengthwise direction and the transverse direction of the substrate 1 concerned and have the half-cut depth from the front surface 10 of the substrate 1 in the thickness direction, and 16 denotes the inner side surface of each of the dicing grooves.

Moreover, the dotted line 18 indicates the formation region of a dicing groove which will be formed in the back surface 11 of the semiconductor substrate 1 by the subsequent cutting process. As shown in FIG. 2A, the subsequently formed dicing groove overlaps the dicing grooves 14A and 14B formed in the front surface 10 of the substrate 1.

When forming the dicing grooves 14A and 14B or the dicing grooves 15A and 15B as shown in FIG. 2A, the dicing is performed on the front surface 10 of the substrate 1 using the half cut method so that the substrate 1 is cut to the depth that is about the half of the thickness T of the substrate 1. The dicing grooves 14A and 14B or the dicing grooves 15A and 15B are formed on both the sides of the dicing line DLx or DLy along the metal layer 2 arranged at the outermost periphery of the semiconductor chip concerned.

At this time, each dicing groove is formed so that the outer edge of the dicing groove (on the side of the semiconductor chip) is at a fixed distance from the metal layer 2 at the outermost periphery of the semiconductor chip concerned.

By performing the dicing process using the half cut method, it is possible to prevent cracking and scattering of the intermediate portion 1A of the semiconductor substrate 1 between the dicing grooves 14A and 14B or between the dicing grooves 15A and 15B.

In the case of the semiconductor substrate 1 which is about 550 micrometers thick, the cutting width of the dicing grooves 14A, 14B, 15A and 15B on the front surface 10 is in the range of 20-25 micrometers, the cutting depth is in the range of 100-200 micrometers, and the scribe width B between the metal layers 2 at the outermost periphery of the neighboring semiconductor chips is about 150 micrometers.

And these dicing grooves 14A, 14B, 15A and 15B have side surfaces with a positive taper toward the depth direction from the front surface 10 of the semiconductor substrate 1. In this respect, a positive taper means that the groove width gradually decreases as the groove depth increases, while a negative taper means that the groove width gradually increases as the groove depth increases.

Figure 3:
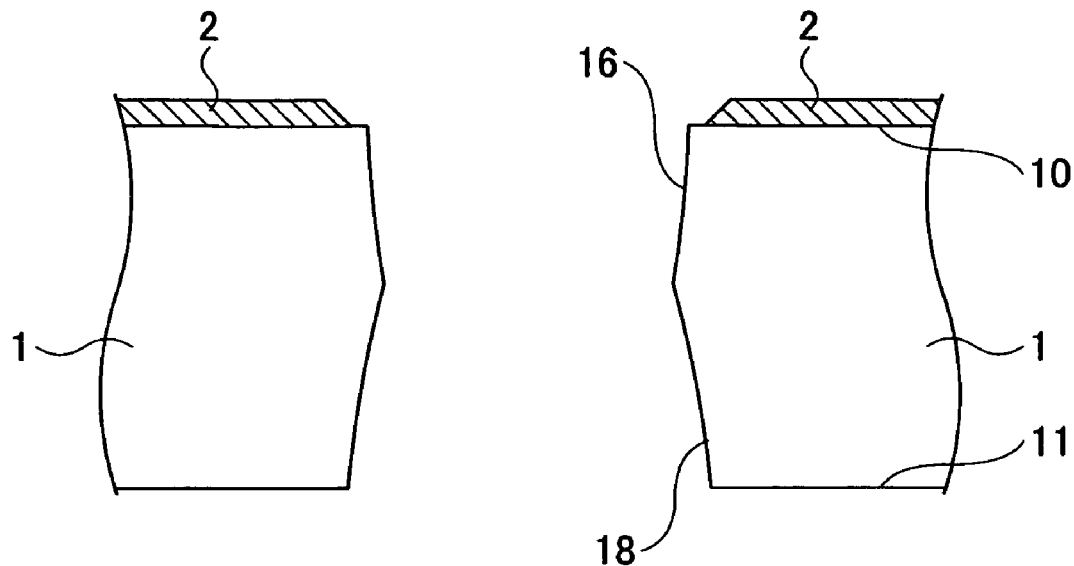
FIG. 3 is a diagram showing the condition in which the second dicing process is performed to cut the substrate of FIG. 2A into the semiconductor chips.

In the manufacturing method of the present embodiment, the second dicing process is performed after the dicing process shown in FIG. 2A is performed. FIG. 3 shows the condition in which the second dicing process is performed to cut of the substrate of FIG. 2A into the semiconductor chips.

In this second dicing process, a dicing groove 18 is formed in the back surface 11 of the substrate 1, and this dicing groove 18 overlaps the two cutting grooves 14A and 14B (or 15A and 15B) formed in the front surface 10 of the substrate 1.

At this time, the second dicing process is performed along the dicing line DL, so that the deepest part of this dicing groove is located at the corresponding position between the two cutting grooves. The cutting surface indicated by the dotted line in FIG. 2A represents the outline of the dicing groove 18 formed in the back surface 11 of the substrate 1 by the second dicing process.

In the second dicing process, the dicing is performed using a dicing blade having a width larger than the width B of the scribe line which is used in the first dicing process.

At this time, the outer edges 18A and 18B of the dicing groove 18 in the back surface 11 of the substrate 1 have the width larger than the width B of the scribe line, and the outer edges 18A and 18B are located outside the outer edges of the metal layer 2 which are arranged at the outermost periphery of the semiconductor chips and form the moisture-resistant ring.

In addition, the depth of the dicing groove 18 is larger than the depth of the dicing grooves 14 and 15. That is, the dicing groove 18 formed in the back surface 11 of the substrate 1 by the second dicing process has side surfaces with a negative taper toward the depth direction from the front surface 10 of the substrate 1.

As shown in FIG. 3, the semiconductor substrate 1 is cut into the semiconductor chips by the second dicing process.

Next, FIG. 7A through FIG. 7D are diagrams for explaining the processing flow of the manufacturing method of the semiconductor device in one embodiment of the invention.

Figure 7A:
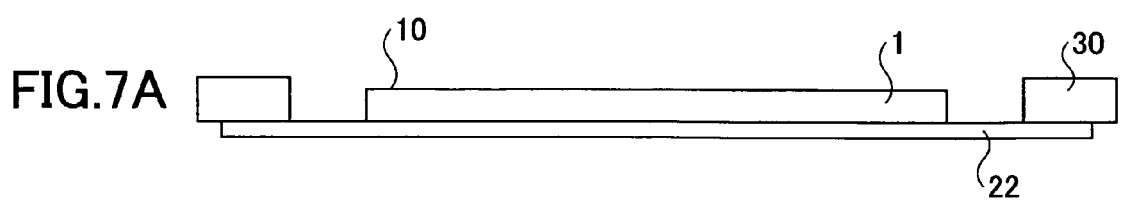
FIG. 7A, FIG. 7B, FIG. 7C and FIG. 7D are diagrams for explaining the processing flow of the semiconductor-device manufacturing method in one embodiment of the invention.

As shown in FIG. 7A, the first dicing tape 22 is attached to the back surface 11 of the semiconductor substrate 1 (wafer) on which the circuit elements are formed on the front surface, and the wafer is fixed to the dicing frame 30 through the dicing tape 22 (the wafer mount process).

Figure 7B:
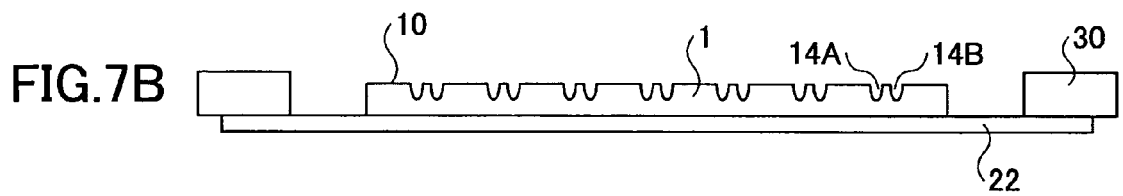

Then, as shown in FIG. 7B, the dicing process is performed on the front surface 10 of the semiconductor substrate 1 on both the sides of the dicing line between the adjoining semiconductor chips, and the cutting depth is about ½ of the thickness of the substrate 1 (the first dicing process).

As a result, two dicing grooves 14A and 14B are formed in the direction of X between the adjoining semiconductor chips, and two dicing grooves 15A and 15B are formed in the direction of Y.

In order to reduce the influences of chipping arising when removing the formation layers, such as the insulating layer and the metal layer, on the front surface of the substrate 1 and to perform exact positioning of the dicing grooves 14, it is desirable to use the known step cut method in the first dicing process.

According to the step cut method, different cutting blades are attached to the two spindle shafts, and the formation layers on the wafer surface are removed by the first one of the cutting blades. Immediately after this, the half cutting of the remaining portion of the wafer is performed with the second one of the cutting blades. Therefore, the step cut method enables highly precise cutting.

Figure 7C:
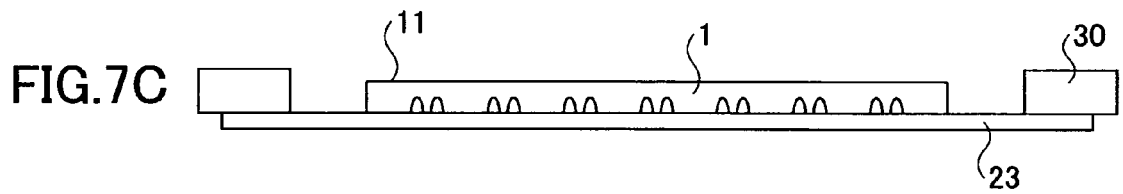

Then, as shown in FIG. 7C, the second dicing tape 23 is attached to the front surface 10 of the substrate 1, and the first dicing tape 22 is removed from the back surface 11 of the substrate 1 (the tape attaching process). And the semiconductor substrate 1 concerned is fixed to the dicing frame 30 through the dicing tape 23 with the back surface 11 placed upside.

Figure 7D:
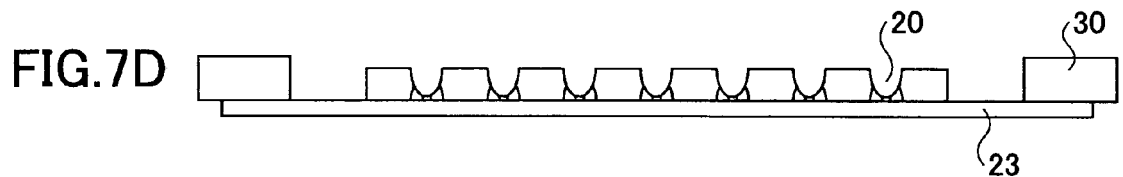

Then, as shown in FIG. 7D, the dicing process is performed on the back surface 11 of the substrate 1 along the scribe line, using the cutting blade having a width larger than the width B of the scribe line, so that the dicing groove 20 is formed (the second dicing process).

As a result of the second dicing process, the semiconductor substrate 1 is cut into the semiconductor chips while the dicing tape 23 is attached.

In addition, in the second dicing process, the positioning of the dicing blade is carried out using the infrared laser microscope which is fixed to the dicing frame 30, as follows. The dicing blade is positioned on the substrate 1 by viewing the monitor which displays the image of the back surface of the substrate 1 in the condition of FIG. 7D on the basis of the image of the front surface of the substrate 1 in the condition of FIG. 7B.

After the second dicing process is performed, another dicing tape is attached to the back surface on which the semiconductor chips are separated from each other, and the second dicing tape 23 on the front surface side is removed.

The resulting semiconductor chips are taken up by using the suction collet or the like. And they are mounted on the package formation component for accommodating the semiconductor device, or the wiring board (the mother board or the interposer) of the electronic device.

Figure 4:
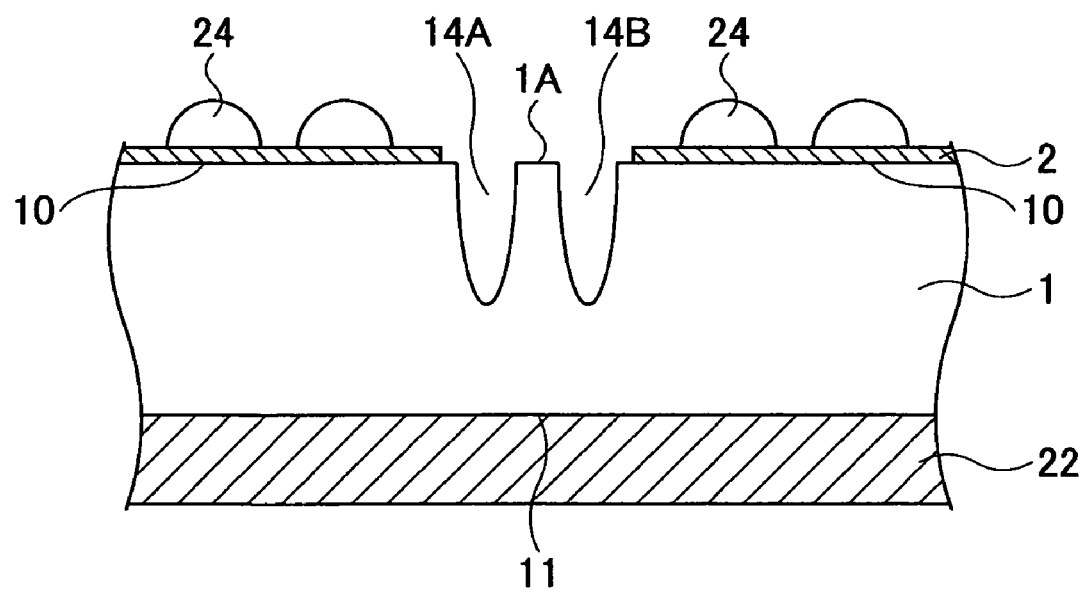
FIG. 4 is a diagram showing the condition in which the first dicing process is performed according to the semiconductor-device manufacturing method in another embodiment of the invention.
Figure 5:
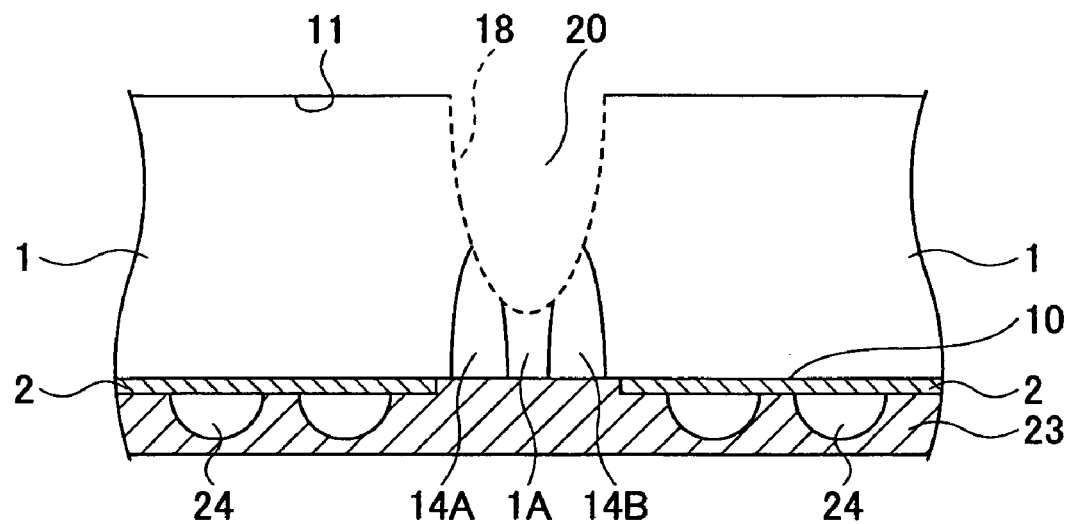
FIG. 5 is a diagram showing the condition in which the second dicing process is performed for the substrate of FIG. 4.

Next, FIG. 4 shows the condition in which the first dicing process is performed according to the semiconductor-device manufacturing method in another embodiment of the invention. FIG. 5 shows the condition in which the second dicing process is performed for the substrate of FIG. 4.

As shown in FIG. 4 and FIG. 5, the semiconductor substrate 1 in the present embodiment is provided with the projection electrodes (bumps) as the electrodes for external connection.

In FIG. 4 and FIG. 5, the reference numeral 1 denotes the semiconductor substrate (wafer), 2 denotes the electrode layer which forms a part of the semiconductor chip, 10 denotes the front surface of the substrate 1, 11 denotes the back surface of the substrate 1, 14A and 14B denote the dicing grooves formed in the front surface of the substrate 1, and 22 denotes the dicing tape attached to the back surface 11 of the substrate 1.

Moreover, in FIG. 4 and FIG. 5, the reference 24 denotes the projection electrodes (bumps) disposed on each of the plurality of semiconductor chips on the front surface 10 of the substrate 1, respectively.

In the first dicing process shown in FIG. 4, the dicing tape 22 is attached to the back surface 11 of the semiconductor substrate 1, and this semiconductor substrate 1 is fixed to the dicing frame (not shown) through the dicing tape 22 (the wafer mount process).

In the above-mentioned condition, the dicing is performed on the front surface 10 of the substrate 1 using the half cut method so that the substrate 1 is cut to the depth that is about the half of the thickness of the substrate 1. The dicing grooves 14A and 14B are formed on both the sides of the dicing line along the metal layer 2 arranged at the outermost periphery of the semiconductor chip concerned.

At this time, each dicing groove is formed so that the outer edge of the dicing groove (on the side of the semiconductor chip) is at a fixed distance from the metal layer 2 at the outermost periphery of the semiconductor chip concerned. The dicing grooves formed in the front surface 10 of the substrate 1 have side surfaces with a positive taper toward the depth direction from the front surface 10 of the substrate 1.

After the first dicing process of FIG. 4 is performed, the second dicing process is performed on the back surface 11 of the substrate 1 is performed. Before the second dicing process is performed, the dicing tape 23 is attached to the front surface 10 of the substrate 1, and the dicing tape 22 attached to the back surface 11 of the substrate 1 is removed.

After an appropriate time, the dicing groove 20 is formed in the back surface 11 of the substrate 1, and this dicing groove 20 overlaps the two dicing grooves 14A and 14B formed in the front surface 10 of the substrate 1 on both the sides of the dicing line.

FIG. 5 shows the condition in which the second dicing process is performed on the back surface 11 of the substrate 1 according to the semiconductor-device manufacturing method of the present embodiment.

In the second dicing process of FIG. 5, the dicing process is performed along the dicing line on the back surface 11 of the substrate 1 using a single dicing blade. This dicing blade has a width larger than the width of the scriber line used in the first dicing process. The deepest part of the dicing groove 20 is located at the corresponding position between the two dicing grooves 14A and 14B. The cutting surface indicated by the dotted line in FIG. 5 represents the outline of the dicing groove 20 formed in the back surface of the substrate 1 by the second dicing process.

At this time, the outer edges of the dicing groove 20 in the back surface 11 of the substrate 1 have the width larger than the width of the scribe line, and these outer edges are located outside the outer edges of the metal layer 2 which are arranged at the outermost periphery of the semiconductor chips and form the moisture-resistant ring.

In addition, the depth of the dicing groove 20 is larger than the depth of the dicing grooves 14A and 14B. The dicing groove 20 formed in the back surface 11 of the substrate 1 by the second dicing process has side surfaces with a negative taper toward the depth direction from the front surface 10 of the substrate 1.

In the present embodiment, an adhesive tape having a flexible layer is used as the dicing tape 23 which is attached to the front surface 10 of the substrate 1 before forming the dicing groove 20 in the back surface 11.

By using the tape having the flexible layer as the dicing tape 23, this dicing tape 23 absorbs the height of the projection electrodes 24 on the front surface 10 of the substrate 1, and comes into contact with the insulating layer (not shown) on the front surface 10 of the substrate 1 as well as the surface of the projection electrodes 24, as shown in FIG. 5.

For this reason, high adhesion strength is obtained and consequently the semiconductor substrate 1 is firmly held by the dicing frame through the dicing tape 23.

Moreover, the semiconductor substrate portion 1A between the dicing grooves 14A and 14B (or between the dicing grooves 15A and 15B) also comes in contact with the dicing tape 23.

Even when the dicing groove 20 is formed and the semiconductor chips and the semiconductor substrate portion 1A are separated from each other, the semiconductor substrate portion 1A remains attached to and held by the dicing tape 23. Therefore, it is possible to prevent scattering of the semiconductor substrate materials when the dicing process is performed.

Figure 6:
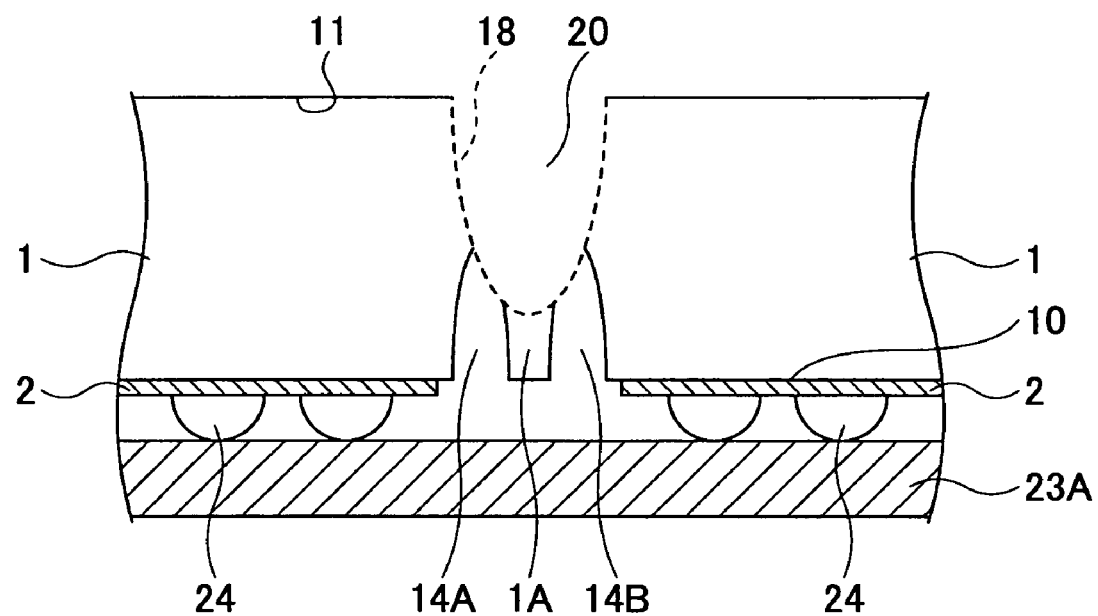
FIG. 6 is a diagram for explaining the problem arising when the second dicing process is performed.

In contrast, in the example of FIG. 6, the adhesive tape 23A having a rigid (less flexible) layer is used as the dicing tape which is attached to the front surface 10 of the substrate 1 before forming the dicing groove 20 in the back surface 11.

Since the height of the projection electrodes 24 cannot be absorbed by the dicing tape 23A as shown in FIG. 6, the adhesion area between the dicing tape 23A and the semiconductor substrate 1 is small. As a result, it is difficult to firmly hold the semiconductor substrate 1 by the dicing frame through the dicing tape 23A.

For this reason, vibrations may arise in the semiconductor substrate 1 during the second dicing process, and there is a possibility that the semiconductor substrate 1 is separated from the dicing tape 23A.

Moreover, since the semiconductor substrate portion 1A between the dicing grooves 14A and 14B is not sufficiently held by the dicing tape 23A, the semiconductor substrate portion 1A formed after the formation of the dicing groove 20 will be dispersed with the cleaning/cooling water. The dispersed material will contact the semiconductor chip portion on the front surface of the semiconductor substrate 1, and will give damage to the semiconductor chip concerned. Otherwise it will remain on the front surface of the semiconductor substrate 1. In such a case, it is necessary to perform again the cleaning process.

The present invention is not limited to the above-described embodiments, and variations and modifications may be made without departing from the scope of the present invention.

What is claimed is:

1. A manufacturing method of a semiconductor device in which a semiconductor substrate having a plurality of semiconductor chips formed on one of principal surfaces of the substrate is cut into the plurality of semiconductor chips through dicing, comprising the steps of:

performing a first cutting process on one of the principal surfaces of the substrate to produce two cutting grooves between two neighbouring ones of the plurality of semiconductor chips, each cutting groove being adjacent to one of the neighbouring ones of the plurality of semiconductor chips; and performing a second cutting process on the other of the principal surfaces of the substrate to produce a cutting groove overlapping the two cutting grooves produced by the first cutting process.

2. The manufacturing method of claim 1 wherein a step cut method is used in the first cutting process.

3. The manufacturing method of claim 1 wherein a dicing blade having a width larger than a width of a scribe line is used in the second cutting process.

4. The manufacturing method of claim 1 wherein the cutting grooves formed in the substrate by the first cutting process have a depth smaller than a depth of the cutting groove formed in the substrate by the second cutting process.

5. The manufacturing method of claim 1 wherein the cutting grooves formed in the substrate by the first cutting process have side surfaces with a positive taper toward a depth direction from the one of the principal surfaces of the substrate.

6. The manufacturing method of claim 1 wherein projection electrodes are formed on each of the plurality of semiconductor chips on the one of the principal surfaces of the substrate.

7. The manufacturing method of claim 1 further comprising the steps of:
    attaching a first dicing tape to the other of the principal surfaces of the substrate before the first cutting process; and
    attaching, after the first cutting process and before the second cutting process, a second dicing tape to the one of the principal surfaces of the substrate and removing the first dicing tape from the other of the principal surfaces of the substrate, wherein the second dicing tape has a flexible layer.

8. The manufacturing method of claim 1 wherein an outside edge of each of the dicing grooves formed in the substrate by the first dicing process is at a predetermined distance from a metal line in an outermost periphery of one of the plurality of semiconductor chips formed on the one of the principal surfaces of the substrate, and an outside edge of the dicing groove formed in the substrate by the second dicing process is located inside a position of the metal line.

9. The manufacturing method of claim 1 wherein a flat electrode layer is formed on each of the plurality of semiconductor chips formed on the one of the principal surfaces of the substrate.

10. The manufacturing method of claim 1 wherein each of the plurality of semiconductor chips produced by the second dicing process has a maximum width at a position near a center of a thickness of the semiconductor chip.

11. The manufacturing method of claim 1 further comprising the step of attaching, after the first cutting process and before the second cutting process, a dicing tape to the one of the principal surfaces of the substrate,
    wherein the dicing tape is brought in contact with an intermediate part of the substrate between the dicing grooves formed in the substrate by the first dicing process.

12. The manufacturing method of claim 1 wherein, in the first dicing process, each of two dicing blades is positioned so that edges of the dicing blade are at a predetermined distance along a dicing line from a metal line located in an outermost periphery of each of the plurality of semiconductor chips formed on the one of the principal surfaces of the substrate.

* * * * *